(12) United States Patent
Simon et al.

(10) Patent No.: US 7,605,019 B2
(45) Date of Patent: Oct. 20, 2009

(54) SEMICONDUCTOR DEVICE WITH STACKED CHIPS AND METHOD FOR MANUFACTURING THEREOF

(75) Inventors: Juergen Simon, Dresden (DE); Harry Hedler, Germering (DE)

(73) Assignee: Qimonda AG, Munich (DE)

( * ) Notice: Subject to any disclaimer, the term of this patent is extended or adjusted under 35 U.S.C. 154(b) by 160 days.

(21) Appl. No.: 11/483,197

(22) Filed: Jul. 7, 2006

(65) Prior Publication Data

US 2008/0032448 A1    Feb. 7, 2008

(51) Int. Cl.
*H01L 21/00* (2006.01)
(52) U.S. Cl. .............. 438/109; 438/110; 438/113; 438/117; 438/118; 438/458; 438/462
(58) Field of Classification Search ......... 438/109–110, 438/113, 117, 118, 458, 462
See application file for complete search history.

(56) References Cited

U.S. PATENT DOCUMENTS 5,229,647 A * 7/1993 Gnadinger ................. 257/785
5,432,999 A * 7/1995 Capps et al. ............... 438/109
6,577,013 B1 * 6/2003 Glenn et al. ............... 257/777
6,908,785 B2 * 6/2005 Kim ........................... 438/106
2004/0238933 A1 * 12/2004 Chen et al. ................. 257/686
2005/0051883 A1 * 3/2005 Fukazawa ................... 257/686
2006/0046468 A1 * 3/2006 Akram et al. ............... 438/637
2006/0216856 A1 * 9/2006 Zhao ........................... 438/106

* cited by examiner

*Primary Examiner*—Kevin M Picardat
*Assistant Examiner*—Bac H Au
(74) *Attorney, Agent, or Firm*—Slater & Matsil, L.L.P.

(57) ABSTRACT

A semiconductor device includes a first semiconductor device and a second semiconductor device. Through-holes in the second semiconductor device extend from an upper side of the second semiconductor device adjacent contact pads to a bottom side of the second device. Tower contact bumps are electrically connected to contact pads of the first semiconductor device. The second semiconductor device is arranged adjacent the first semiconductor device so that the tower contact bumps are disposed within the through-holes and are electrically connected with contact pads of the second semiconductor device.

16 Claims, 9 Drawing Sheets

SEMICONDUCTOR DEVICE WITH STACKED CHIPS AND METHOD FOR MANUFACTURING THEREOF

TECHNICAL FIELD

The present invention relates generally to semiconductor devices, and in a particular embodiment to a semiconductor device with stacked chips and a method of manufacturing the same.

BACKGROUND

To increase the functionality and density of semiconductor devices multiple semiconductor chips are stacked on a substrate or on each other. For instance, chips with the same functions, e.g., memory chips are stacked to increase the memory density or chips with different functions, e.g., processor chip and memory chip are stacked to minimize the processing time. Usually a first chip is mounted on a substrate. This chip is connected to substrate either by bonding bumps using flip-chip technology or by wire bonding. A second chip is then mounted onto the upper side of the first chip. In case of flip-chip bonding the second chip is mounted directly on the back side of the first chip (with an interlaying adhesive tape) or in case of wire bonding with spacers arranged between the first and the second chip for preventing the bonding wires for any damaging. Usually the second chip is also connected to the substrate or to the first chip by wire bonding.

However, the chips are stacked at chip level, i.e., after dicing the chips. Therefore, the manufacturing process is made chip by chip with a low productivity. Sometimes chips after dicing are also called "die." In this specification the term "chip" is used exclusively.

For increasing the productivity a stacking method for stacking chips at wafer level is known, wherein the wafers each having a plurality of semiconductor chips are stacked on each other. The wafers are prepared using any conventional semiconductor manufacturing process. Each semiconductor chip is provided with a plurality of through electrodes typically arranged in a peripheral region of the semiconductor chip and bumps are formed on at least one end surface of the through electrodes to be used as an interconnect element.

A plurality of such wafers are then sequentially stacked so that the corresponding through electrodes or bumps of adjacent semiconductor chips are aligned and brought into contact so as to provide electrical connection between vertical adjacent semiconductor chips. The stacked wafers are then divided into individual chip stack packages.

If the through electrodes are galvanically deposited in a hole through the silicon of the wafer it is necessary to generate a passivation on the inner surface of the through-hole in an additional manufacturing step.

SUMMARY OF THE INVENTION

An exemplary embodiment of the present invention is directed to a method for manufacturing a semiconductor device with stacked chips, which improves the productivity of manufacturing.

The method in accordance with an exemplary embodiment of the present invention may include providing a first semiconductor wafer with first contact pads on the upper side, providing a second semiconductor wafer with second contact pads on the second upper side, placing through-holes into the second semiconductor wafer, arranging tower contact bumps on the first contact pads having a diameter less than the diameter of the through-holes and having a height approximately equal the thickness of the second semiconductor wafer, stacking the second semiconductor wafer on the first semiconductor wafer whereas the tower contact bumps are inserted into the through-holes, and electrically connecting the tower contact bumps and pads.

The tower contact bumps are electrically isolated from the through-holes by an organic material by filling the space between the tower contact bumps and the walls of the through-holes with the organic material. Thereby it is one of the significant advantages of the invention that the space filling by capillary filling does not require a passivation of hole by passivation layer like silicon oxide or silicon nitride.

Another exemplary embodiment of the present invention is directed to a semiconductor device with stacked chips comprising a first semiconductor wafer with first contact pads on the upper side, a second semiconductor wafer with second contact pads on the second upper side having a thickness, through-holes into the second semiconductor wafer, tower contact bumps on the first contact pads having a diameter less than the diameter of the through-holes and having a height approximately equal the thickness of the second semiconductor wafer. The second semiconductor wafer is arranged on the first semiconductor wafer whereas the tower contact bumps are inserted into the through-holes and electrically connected with the second tower contact bumps.

BRIEF DESCRIPTION OF THE DRAWINGS

Exemplary embodiments of the present invention will be readily understood with reference to the detailed description provided below when read in conjunction with the accompanying drawings in which similar or identical reference numerals are used to designate similar or corresponding structural elements, and in which.

The following list of reference symbols can be used in conjunction with the figures:
1. semiconductor wafer (general)
2. semiconductor chip (general)
3. contact pad (general)
4. area for through-hole silicon interconnect
5. contact pad of the first semiconductor wafer
6. surface of the upper side
7. upper side of the first semiconductor wafer
8. first semiconductor wafer
9. chip of the first semiconductor wafer
10. chip border
11. passivation layer
12. tower contact bump
13. sealing layer
14. chip of the second semiconductor wafer
15. second semiconductor wafer
16. through-hole
17. second upper side
18. second contact pad
19. second bottom side of the second semiconductor wafer
20. adhesive layer
21. liqiud adhesive
22. conducting layer
23. second tower contact bumps
24. stack
25. tower contact bump
26. topmost chip
27. solder ball
28. dielectric coating
29. contact area
30. scribe lane
31. fill material
32. further chips

DETAILED DESCRIPTION OF ILLUSTRATIVE EMBODIMENTS

Figure 1:
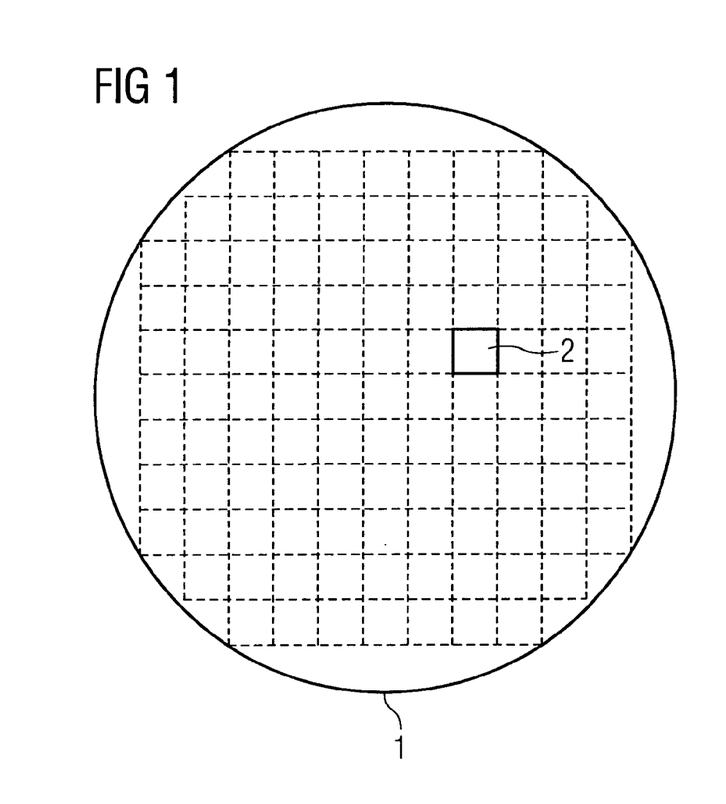
FIG. 1 is a top view of a wafer with multiple chips.
Figure 2:
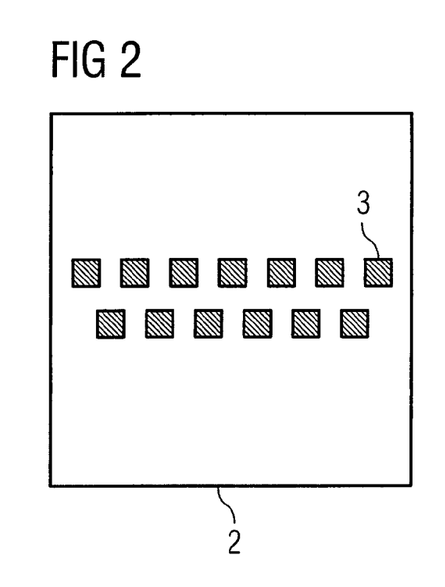
FIG. 2 is a top view of a single chip with contact pads.

As shown in FIG. 1 a semiconductor wafer 1 generally contains multiple semiconductor chips 2. Each chip 2 comprises an electronic circuit (not shown). As shown in FIG. 2 contact pads 3 are arranged on the chip 2 for electrically connecting the electronic circuit with other electronic circuits or with a substrate.

Figure 3:
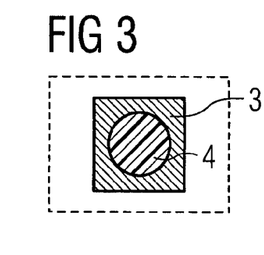
FIG. 3 shows a contact pad with an area for through silicon interconnect in a first design.
Figure 4:
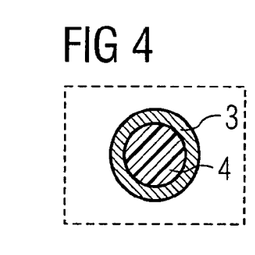
FIG. 4 shows a contact pad with an area for through silicon interconnect in a second design.

At least some of the contact pads 3 are provided with an area 4 for through-hole silicon interconnects. This area 4 is intended for mounting a tower contact bump on a first semiconductor wafer or for placing a through-hole in a second semiconductor wafer as described in more detail below. FIG. 3 or FIG. 4 show different designs of contact pads 3. FIG. 3 shows the contact pad 3 in a square shape with a circular shaped area 4 in the center. FIG. 4 shows a circular shaped contact pad 3 with a co-centrically arranged circular shaped area 4.

Figure 5:
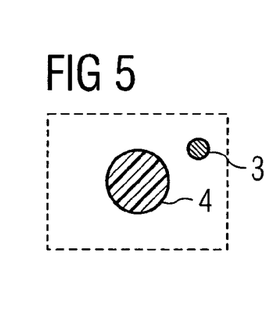
FIG. 5 shows a contact pad displaced in relation to an area for through silicon interconnect.

FIG. 5 shows the case that the contact pad 3 and the area 4 are displaced. As described below the invention allows also in this case establishing a contact between the contact pad 3 and the tower contact bump.

Figure 6:
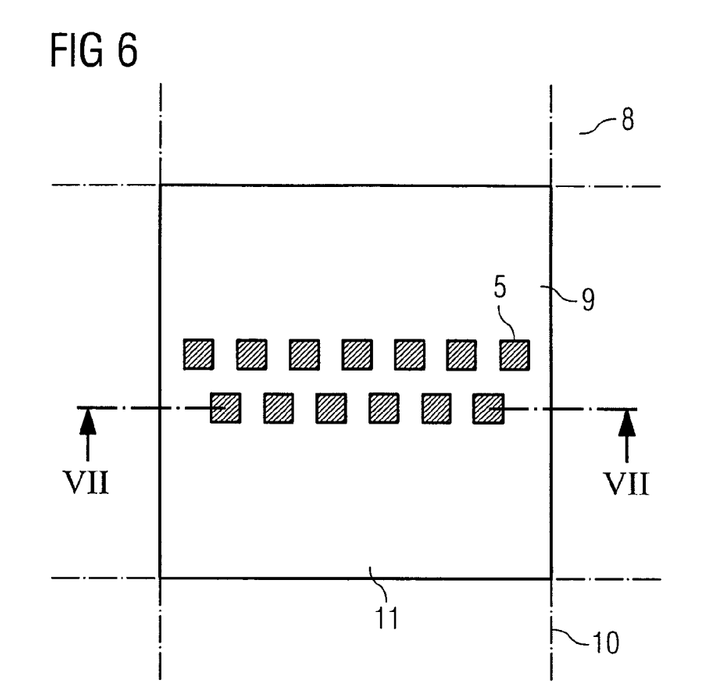
FIG. 6 is a top view of a chip in a wafer at wafer level.
Figure 7:
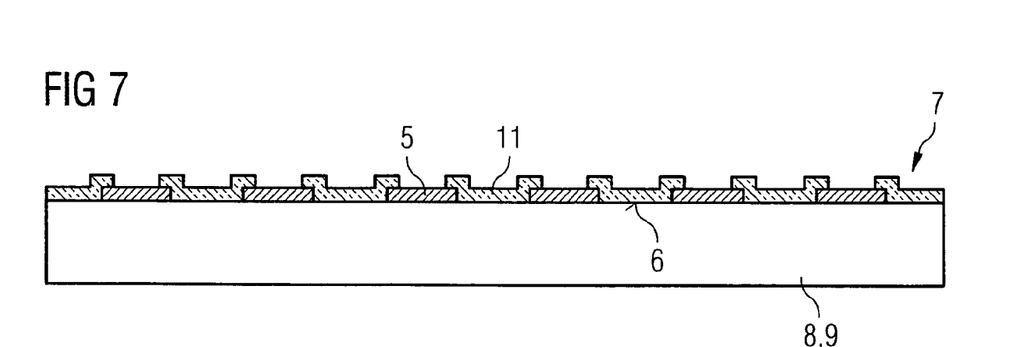
FIG. 7 is a schematic cross section showing contact pads and typical passivation.
Figure 8:
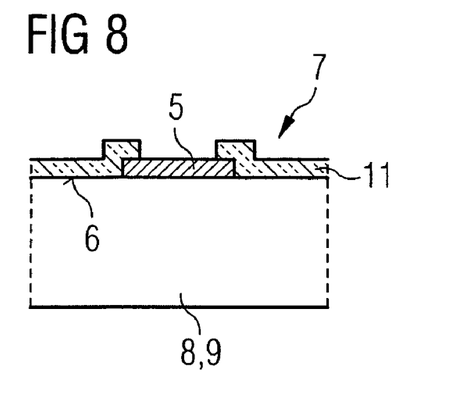
FIG. 8 is a cross section of a single contact pad on a chip of a first wafer.

As shown in FIG. 6 contact pads 5 are arranged on the surface 6 of upper side 7 of a first semiconductor wafer 8 or of a chip 9 within the formation of the first semiconductor wafer 8, i.e. since the chips 9 are still not singulated by dicing along the chip borders 10. FIG. 7 shows a cross section along line VII-VII in FIG. 6 with contact pads 5 on the surface 6 of the upper side 7. Between the contact pads 5 the surface of the upper side 7 of the first semiconductor wafer 8 or of the semiconductor chip 9 a passivation layer 11 is arranged. The passivation layer 11 extends also on the surface of contact pad 5 but only in its border area. FIG. 8 shows this in more detail.

Figure 9:
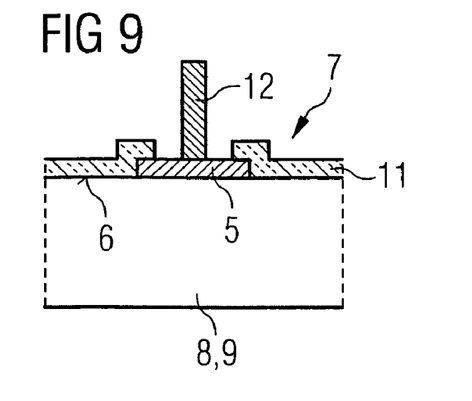
FIG. 9 is a cross section of the single contact pad with a tower contact bump.
Figure 10:
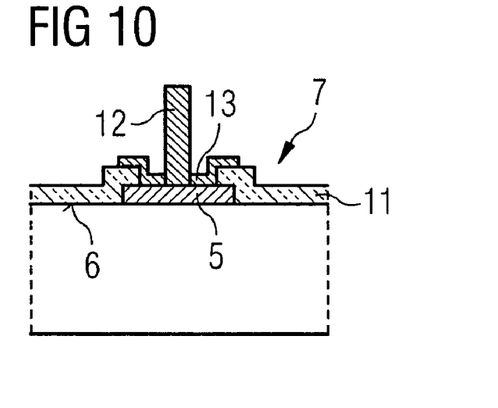
FIG. 10 is a cross section of the single contact pad with an additional pad sealing.

Within the area 4 a tower contact bump 12 is arranged on the contact pad 5 as shown in FIG. 9. This tower contact bump 12 has a height corresponding to the thickness of the second semiconductor wafer and the bonding layer as described in more detail below. The tower contact bump 12 is made of Cu, Au or other electrically conductive material. At the bottom of the tower contact bump 12 the contact pad 5 may be provided with an additional pad sealing layer 13 as shown in FIG. 10, which also may connect the tower bump to the pad for a pad design like FIGS. 3 or 4. Thereby the surface of the contact pad 5 is protected against environmental influence. Another purpose is served by making the pad sealing layer 13 of conductive material. Thereby the tower contact bump 12 can be electrically connected to the contact pad 5 if the area 4 is displaced relative to the contact pad 5 as shown in FIG. 5 by the example of a general contact pad 3 (i.e., the contact pad 3 is independent from placing on the first or on the second semiconductor wafer). The sealing layer 13 made of conductive material can also be a part of a redistribution layer (not shown) on the upper side of the chip 9 of the first semiconductor wafer 8.

Figure 11:
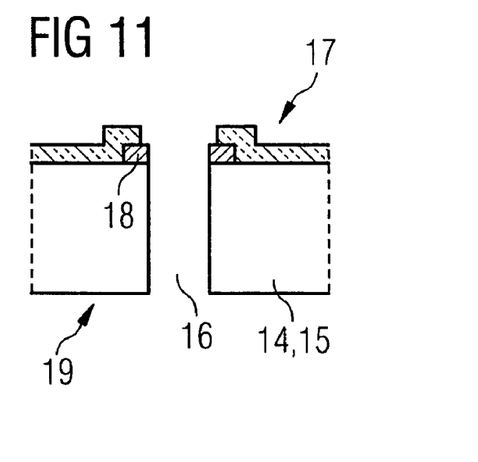
FIG. 11 is a cross section of a single contact pad on a chip of a second wafer with a through-hole.
Figure 12:
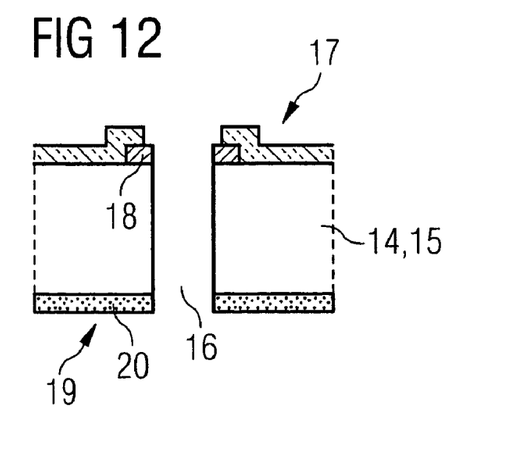
FIG. 12 is a cross section of a single contact pad on a chip of a second wafer with a through-hole and an adhesive layer on the bottom side.

As shown in FIG. 11 and FIG. 12, the chips 14 of a second semiconductor wafer 15 are provided with through-holes 16 with a larger diameter than the diameter of the tower contact bumps 12. The through-holes are extending from the second upper side 17 of the second semiconductor wafer 15 in the area 4 of the second contact pads 18 to the second bottom side 19 of the second semiconductor wafer 15. Thereby the second semiconductor wafer 15 is suitable for stacking onto the first semiconductor wafer 8.

There are two kinds of mounting the second semiconductor wafer 15 on the first semiconductor wafer 8: mounting with a liquid adhesive as shown in FIG. 13 to FIG. 17; and mounting with an adhesive layer 20 on the second bottom side 19 as shown in FIG. 20 to FIG. 25. When using the liquid adhesive method the second bottom side 19 is left blank, as shown in FIG. 11. For usage of the adhesive layer method the through hole 16 may also extend through the adhesive layer 20 as shown in FIG. 12. In case the adhesive layer 20 is made up of soft material, it is not necessary to extend the through-hole 16 into the adhesive layer 20. The tower bumps are then able to pierce the adhesive layer 20.

Figure 13:
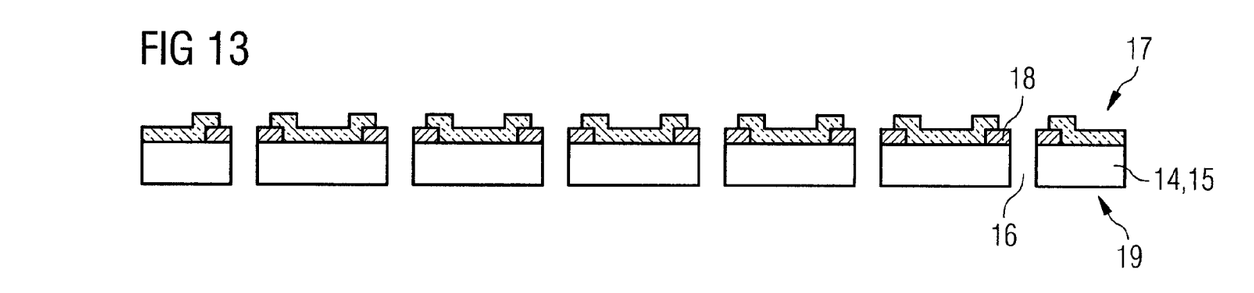
FIG. 13 is a cross section of a second semiconductor wafer with through-holes for wafer stacking.
Figure 14:
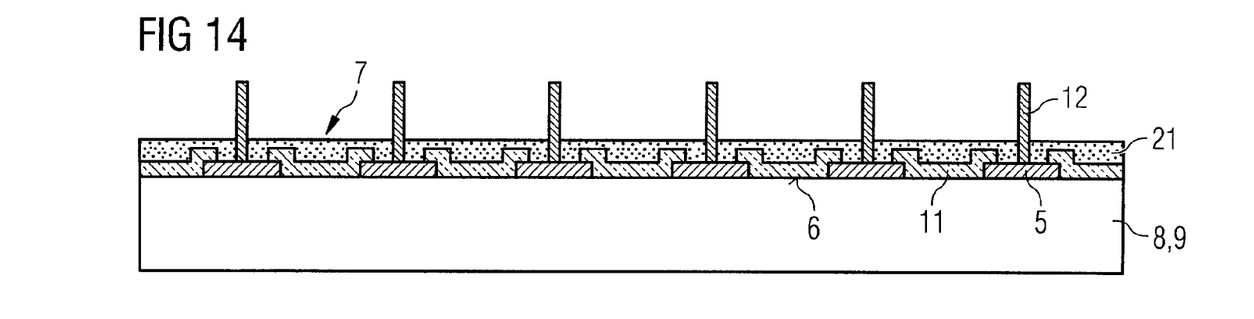
FIG. 14 is a cross section of a first semiconductor wafer with tower contact bumps and liquid adhesive for bonding and capillary filling.
Figure 15:
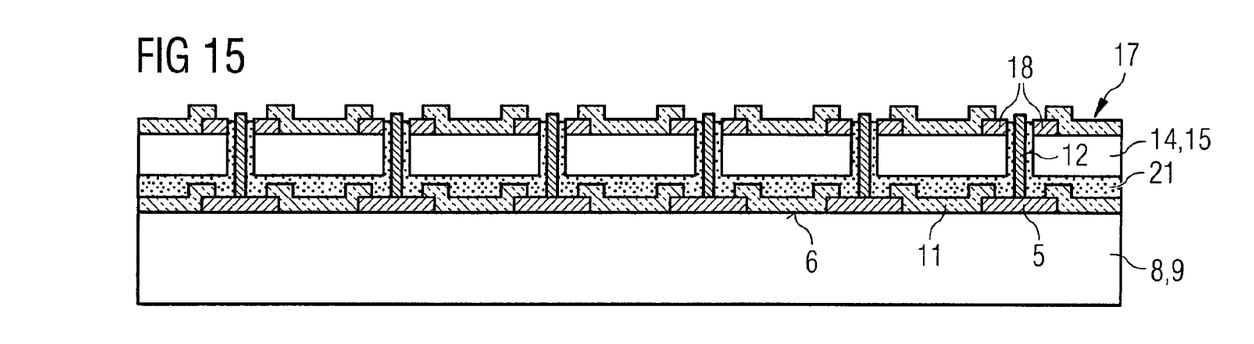
FIG. 15 is a cross section of an arrangement of the second semiconductor wafer bonded on the first semiconductor wafer.
Figure 16:
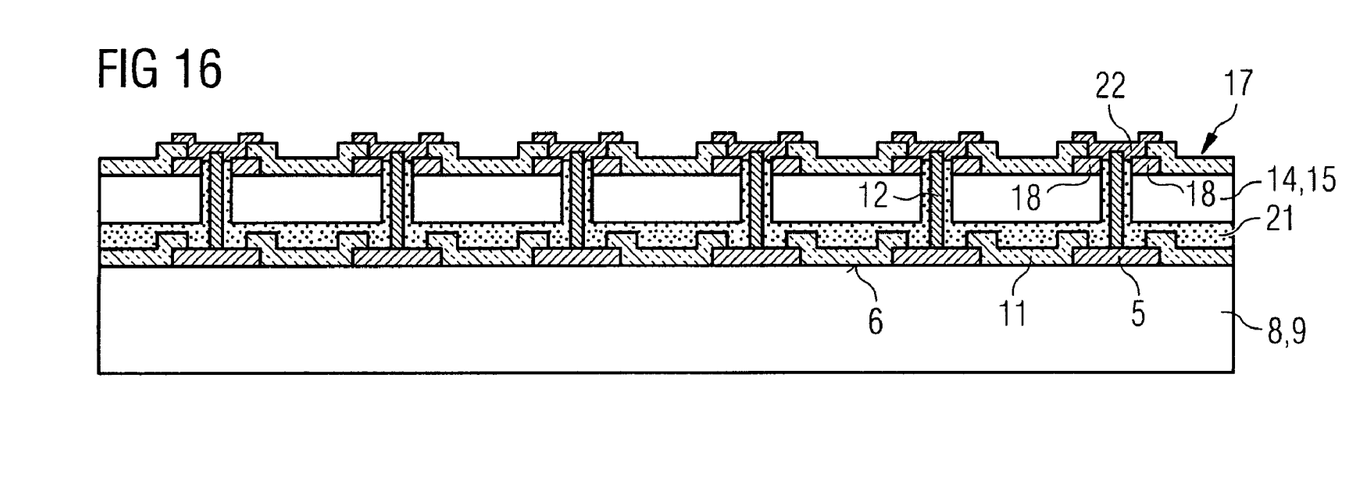
FIG. 16 is a cross section of the arrangement as shown in FIG. 15 provided with electric connections between the tops of the tower contact bumps and the contact pads of the chips on the second semiconductor wafer.

As shown in FIG. 13 a thinned second semiconductor wafer 15 is prepared with through-holes 16 for stacking. In FIG. 14, the first semiconductor wafer 8 is prepared with tower contact bumps 12 and with a liquid adhesive 21 for bonding the second bottom side 19 on the first upper side 7 and for capillary filling the gaps between the tower contact bumps 12 and the through holes 16 remaining after stacking as shown in FIG. 16. The capillary gap filling causes also an electrical isolation of the tower contact bumps 12.

Thereafter the surface of the second upper side 17 is covered with a seed layer (not shown) as a plating base. The seed layer is then covered with a mask structured in a lithography process so that the parts of the surface of the upper side of the second semiconductor wafer to be plated with a conducting layer 22 in a further process step are bare. After structuring the mask the conductive layer 22 is plated and the mask is stripped. This state is shown in FIG. 16. Therein the conducting layer 22 is electrically connecting the top of tower contact bump 12 with the second contact pads 18 of the second semiconductor wafer 15. This is the reason why the height of the tower contact bump 12 is about equal to the thickness of the second semiconductor wafer 15 and the bonding layer 20, 21. Thereby the first contact pads 5 are electrically connected to the second contact pads 18 via the tower contact bump 12.

In the case of stacking only two wafers, the interconnection of the tower bump and the interconnection may also be performed by stencil printing a conductive organic paste to reduce the cost with respect to electroplating.

In case only two semiconductor wafers 8, 15 should be stacked, the stack of the semiconductor wafers 8, 15 could be diced into individual stacks for mounting complete semiconductor devices.

Figure 17:
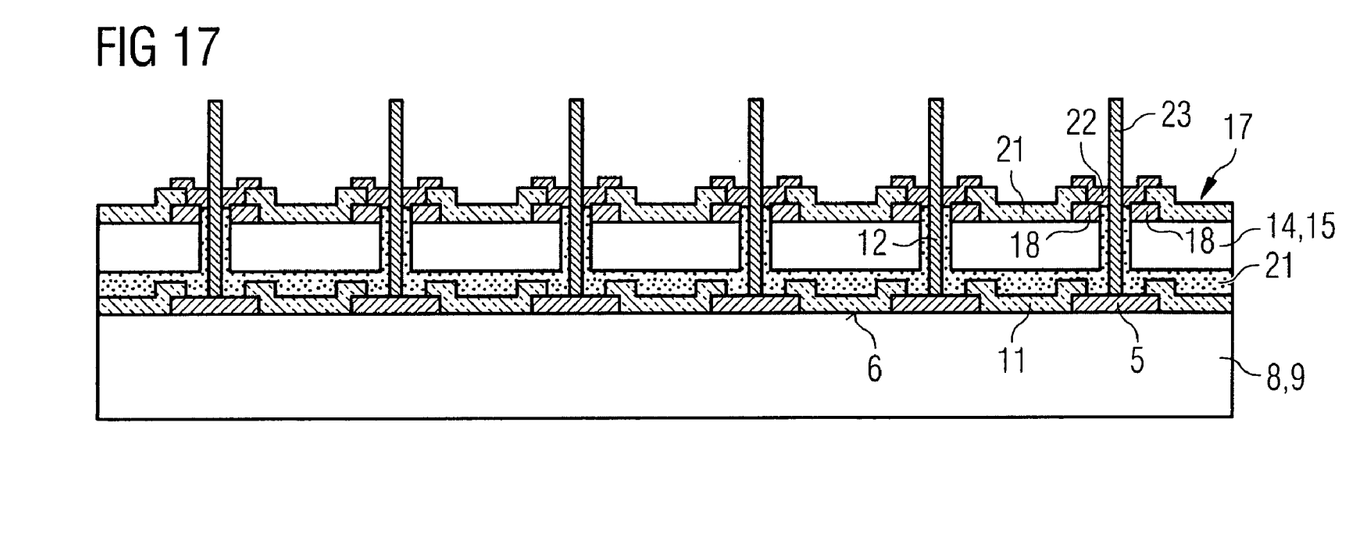
FIG. 17 is a cross section of the arrangement as shown in FIG. 16 provided with further tower contact bumps for mounting of a further semiconductor wafer in the manner of the second semiconductor wafer.

Otherwise, as shown in FIG. 17 it is also possible to provide also the second contact pads 18 with second tower contact bumps 23 for stacking a third semiconductor wafer (not shown) onto the second semiconductor wafer 15 in the same manner as explained above for mounting the second semiconductor wafer 15 onto the first semiconductor wafer 8. In the same manner multiple semiconductor wafers can be stacked on each other. In this case the seed layer is either used to electroplate the interconnection between the tower contact bumps and the corresponding second pads and secondly the tower contact bumps. When stacking is finished, the stacks are singulated by dicing for completion to semiconductor devices within further process steps not explained here in detail.

Figure 18:
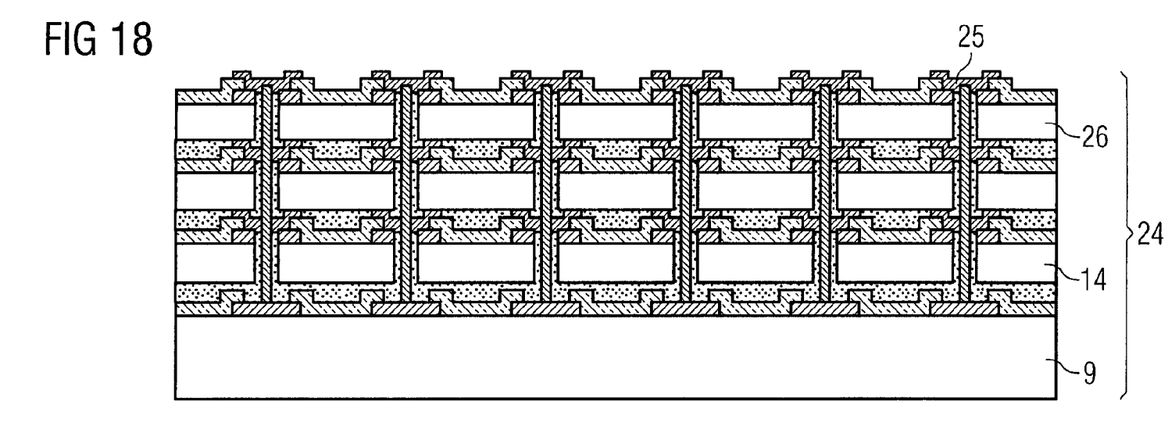
FIG. 18 is a cross section of a 4-fold stack of chips after dicing.

Such a stack 24 manufactured by stacking four semiconductor wafers is shown in FIG. 18. Therein the first semiconductor wafer 8 was not thinned before stacking to improve handling. Therefore, the first chip 9, which is thicker than, e.g., the second chip 14, serves as a stabilizing element. The first wafer may be thinned after stacking to reduce the height of the stack.

Figure 19:
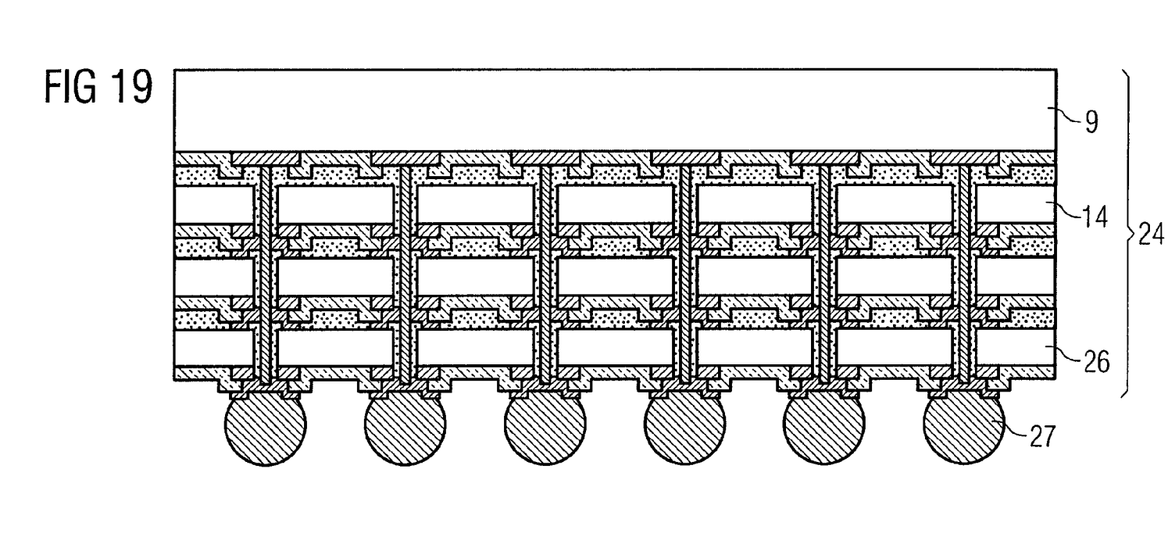
FIG. 19 is a cross section of the 4-fold stack as shown in FIG. 18 provided with inter connect elements for attaching on a substrate.

As shown in FIG. 19, the tops of the tower contact bumps 25 of the topmost chips 26 are provided with solder balls 27 for an interposer level attach or a board level attach.

FIG. 20 to FIG. 25 shows another embodiment of the invention, i.e., a second possibility of wafer bonding and gap filling. Same reference numbers are referring to same elements as depicted in the other figures.

Figure 20:
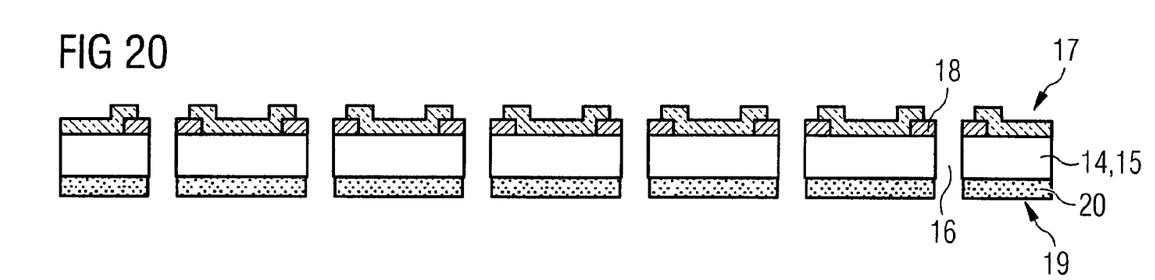
FIG. 20 is a cross section of a second semiconductor wafer with through-holes for wafer stacking and wafer bonding adhesive.
Figure 21:
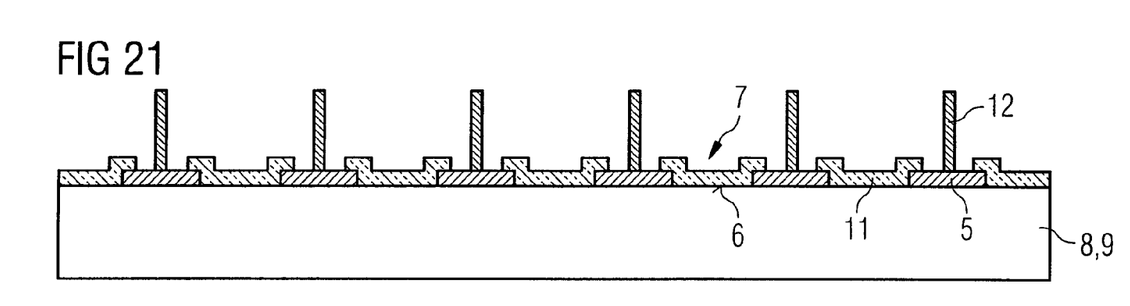
FIG. 21 is a cross section of a first semiconductor wafer with tower contact bumps.
Figure 22:
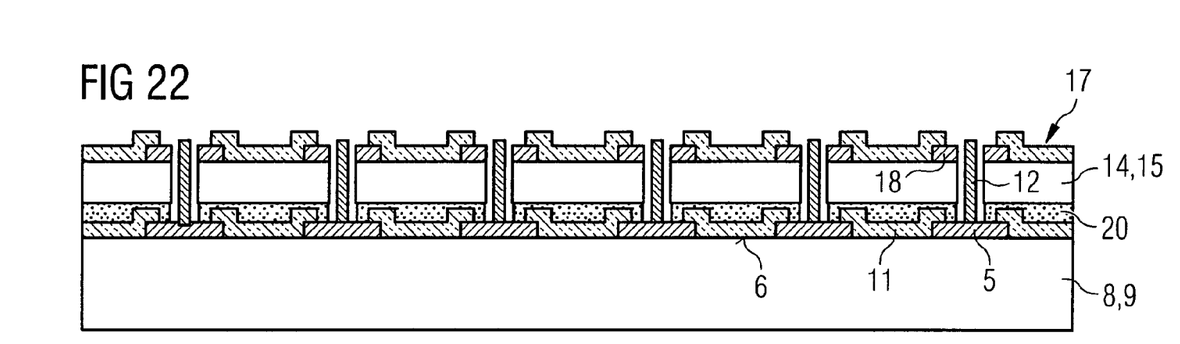
FIG. 22 is a cross section of an arrangement of the second semiconductor wafer bonded on the first semiconductor wafer.
Figure 23:
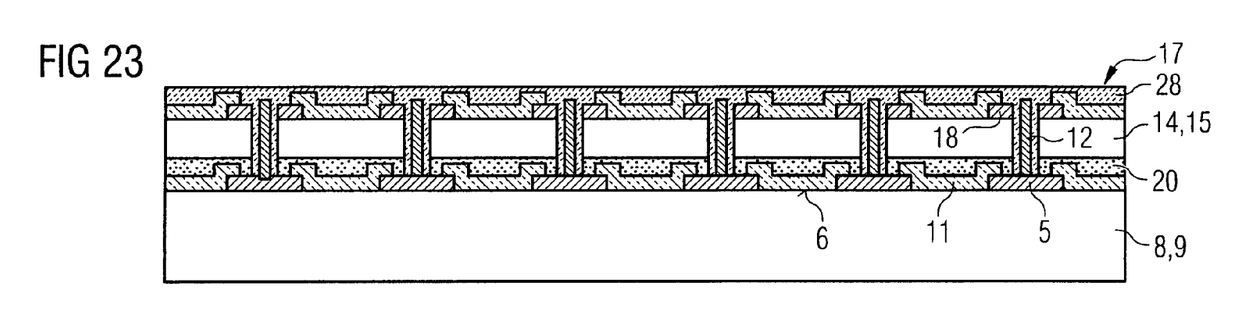
FIG. 23 is a cross section of an arrangement as shown in FIG. 22 provided with photosensitive dielectric coating and capillary gap filling.

As shown in FIG. 20 a thinned second semiconductor wafer 15 is prepared with through-holes 16 for stacking. On the bottom side 19 of the second semiconductor wafer 15 is attached the adhesive layer 20. The through holes 16 are penetrating also the adhesive layer 20. In FIG. 21 the first semiconductor wafer 8 is prepared with tower contact bumps 12. In FIG. 22 the second semiconductor wafer 15 is mounted on the first semiconductor wafer 8 by bonding the second bottom side 19 on the first upper side 7 with the adhesive layer 20. In FIG. 23 the second upper side 17 of the second semiconductor wafer 15 is covered with a photosensitive dielectric coating 28. The coating 28 also yields to a capillary filling of the gaps between the tower contact bumps 12 and the through holes 16 remaining after stacking. The capillary gap filling provides an isolation of the tower contact bumps 12.

Figure 24:
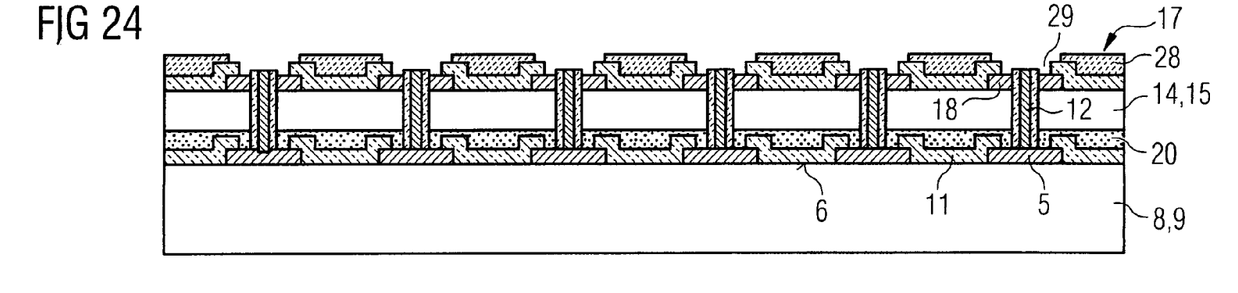
FIG. 24 is a cross section of the arrangement as shown in FIG. 23 with openings of contact areas.

Thereafter the contact areas 29 of the second upper side 17 are opened by a lithography process. The contact areas 29 and the tops of the tower contact bumps 12 are covered with the conducting layer 22 interconnecting the tower contact bumps 25 with second contact pads 18. Again, the height of the tower contact bump 12 is at least equal the thickness of the second semiconductor wafer 15 and the adhesive layer 20.

Figure 25:
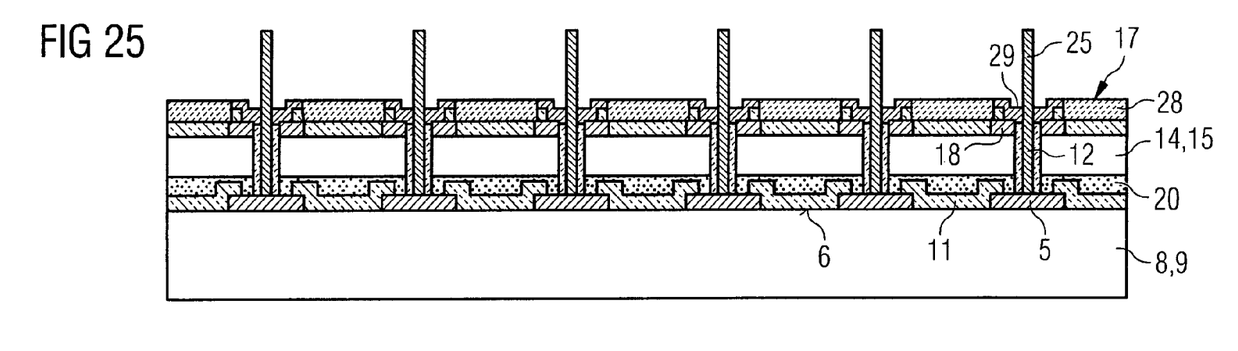
FIG. 25 is a cross section of the arrangement as shown in FIG. 24 provided with further tower contact bumps for mounting of a further semiconductor wafer in the manner of the second semiconductor wafer.

As shown in FIG. 25 the second contact pads 18 are provided with second tower contact bumps 23 for stacking a third semiconductor wafer (not shown) onto the second semiconductor wafer 15 in the same manner as explained above for mounting the second semiconductor wafer 15 onto the first semiconductor wafer 8. In the same manner multiple semiconductor wafers can be stacked on each other. When stacking is finished the stacks are singulated by dicing for completion to semiconductor devices within further process steps not explained here in detail.

Figure 26:
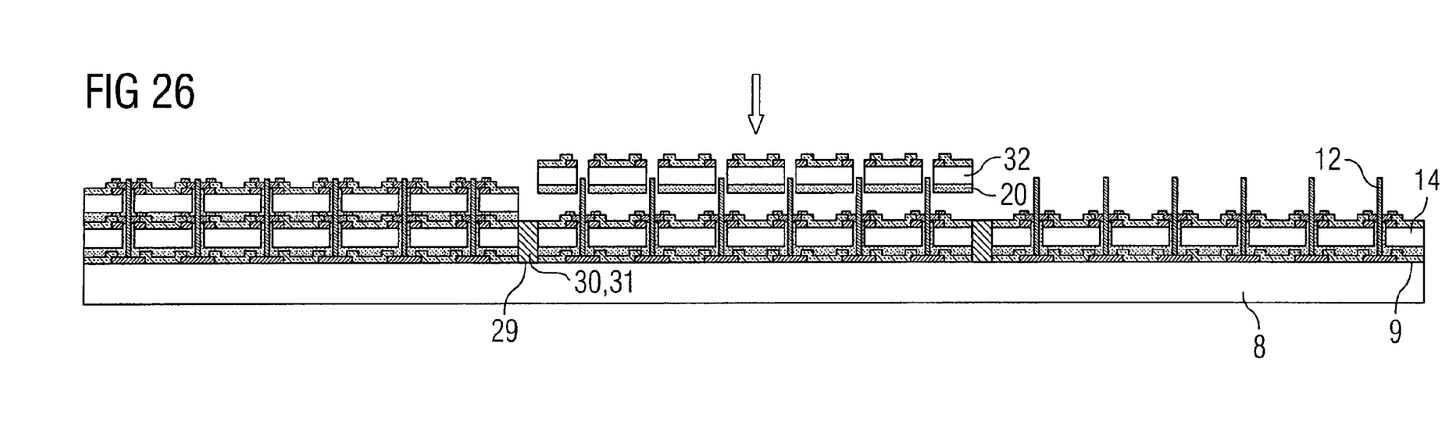
FIG. 26 is a cross section of another embodiment of the invention with chips stacked on the first semiconductor wafer.

As shown in FIG. 26 it is also possible to stack singulated chips 14 of the second semiconductor wafer 15 onto the chips 9 of the first semiconductor wafer 8. The stacking process can also be repeated several times by stacking further chips 32 onto the upper chips 14. Thereby it is advantageous to fill the scribe lanes 30 with a fill material 31 to apply a plating base for a seed layer. In this case the chips 9, 14 can also be tested before mounting to avoid mounting of damaged chips.

In this process the chips 9, 14, 32 can be tested before stacking and only good chips will be used for mounting. In case a chip 9 of the first semiconductor wafer 8 is detected as a faulty chip it cannot be replaced because the chips 9 of the first semiconductor wafer 8 are still associated within the wafer assembly. To avoid a gap in the level of the chips 14 or in further levels of further chips 32 it is advantageous to stack other faulty chips or dummy chips on the stack of the faulty chip 9 of the first semiconductor wafer 8.

What is claimed is:

1. A method for manufacturing a semiconductor device with stacked chips, the method comprising:
   providing a first semiconductor wafer with a first upper side and a first bottom side opposite to the first upper side, the first semiconductor wafer including first contact pads on the first upper side;
   providing a second semiconductor wafer with a second upper side and a second bottom side opposite to the second upper side, the second semiconductor wafer including second contact pads on the second upper side and having a thickness;

forming through-holes into the second semiconductor wafer extending from the second upper side in an area of the second contact pads to the second bottom side;

arranging tower contact bumps on the first contact pads, the tower contact pads having a diameter less than a diameter of the through-holes;

stacking the second semiconductor wafer on the first semiconductor wafer wherein the second bottom side and the first upper side are relatively moved to each other and wherein the tower contact bumps are inserted into the through-holes; and electrically connecting the tower contact bumps with the second contact pads;

wherein the second bottom side is provided with an adhesive layer thereby bonding the second bottom side on the first upper side when stacking and the second upper side is covered with a photosensitive dielectric coating after stacking thereby filling the space between the tower contact bumps and the walls of the through-holes with the photosensitive dielectric coating.

2. The method according to claim 1, wherein the tower contact bumps have a height that is approximately equal to a sum of the thickness of the second semiconductor wafer and a thickness of the second contact pads.

3. The method according to claim 1, wherein the first upper side is covered with a liquid adhesive before stacking.

4. The method according to claim 1, further comprising:
depositing a seed layer as a plating base onto the second upper side;
forming a plating mask with mask openings onto the seed layer of the second upper side, and
depositing a conductive layer within the mask openings, thereby covering the top of the tower contact bumps and the second contact pads and thereby forming interconnections between the tower contact bumps and the second contact pads by electrically connecting the tower contact bumps with the second contact pads.

5. The method according to claim 4, wherein the tower contact bumps comprise a material suitable for electroplating.

6. The method according to claim 4, wherein the interconnections comprise copper interconnections.

7. The method according to claim 4, wherein the contact pads comprise gold.

8. The method according to claim 4, wherein the interconnections comprise, and the tops of the tower contact bumps are covered with, a conductive material suitable for electroplating.

9. The method according to claim 1, further comprising separating the first and second semiconductor wafers into a plurality of individual stacks.

10. The method according to claim 9, wherein the separating is performed after the second semiconductor wafer is stacked on the first semiconductor wafer.

11. The method according to claim 9, wherein the second semiconductor wafer is separated into a plurality of second chips before the second semiconductor wafer is stacked on the first semiconductor wafer and wherein stacking the second semiconductor wafer on the first semiconductor wafer comprises individually stacking a second chip onto a first chip of the first wafer wherein the second bottom side of the second chip and the first upper side of the first chip are relatively moved to each other and wherein the tower contact bumps are penetrating into the through-holes.

12. The method according to claim 11, further comprising filling gaps between the individual second chips.

13. The method according to claim 11, further comprising testing the second chips.

14. The method according to claim 13, wherein the testing occurs before the second semiconductor wafer is separated into the plurality of second chips.

15. The method according to claim 13, wherein the testing occurs after the second semiconductor wafer is separated into a plurality of second chips.

16. The method according to claim 13, wherein the testing finds at least one faulty second chip and wherein individually stacking further comprises stacking the at least one faulty second chip over a faulty first chip of the first semiconductor wafer.

* * * * *